United States Patent [19]
Wen

[11] Patent Number: 5,981,443
[45] Date of Patent: Nov. 9, 1999

[54] METHOD OF MANUFACTURING A HIGH TEMPERATURE SUPERCONDUCTING JOSEPHSON DEVICE

[75] Inventor: Zhongmin Wen, Tokyo, Japan

[73] Assignee: Oki Electric Industry Co., Ltd., Tokyo, Japan

[21] Appl. No.: 09/140,661

[22] Filed: Aug. 26, 1998

Related U.S. Application Data

[62] Division of application No. 08/652,680, May 30, 1996, Pat. No. 5,849,669.

[30] Foreign Application Priority Data

Jun. 23, 1995 [JP] Japan ..................................... 7-157567

[51] Int. Cl.$^6$ .............................. H01L 39/22; H01L 39/24
[52] U.S. Cl. ......................... 505/329; 505/410; 427/63; 216/3; 29/599
[58] Field of Search .................................... 505/329, 410, 505/413; 427/62, 63; 216/3; 29/599; 156/89.12

[56] References Cited

U.S. PATENT DOCUMENTS

| | | | |
|---|---|---|---|
| 5,196,395 | 3/1993 | James et al. ............................. | 505/329 |
| 5,219,826 | 6/1993 | Kapitulnik ............................... | 505/329 |
| 5,543,630 | 8/1996 | Bliss et al. ................................ | 257/33 |
| 5,595,959 | 1/1997 | Diiorio et al. ........................... | 505/329 |

OTHER PUBLICATIONS

D. Dimos et al., "Orientation Dependence of Grain–Boundary Critical Currents in YBa2Cu3O7 –Bicrystals", Physical Review Letters, vol. 61, No. 2, Jul. 11, 1988, pp. 219–222.

B. Mayer et al., "Superconducting Transport Properties of Bi2Sr2CaCu2O8+x Bicrystal Grain Boundary Junctions", Appl. Phys. Lett. 63 (7), Aug. 16, 1993, pp. 996–998.

D. Dimos et al., "Superconducting Transport Properties of Grain Boundaries in YBa2Cu3O7 Bicrystals", Physical Review B. vol. 41, No. 7, Mar. 1, 1990, pp. 4038–4049.

T. Van Duzer and C.W. Turner, "Principles of the Superconductive Devices and Circuits", Elsevier, New York, Chapter 7, Sections 7.9 and 7.10, pp. 299–305, 1981.

M.A.M. Gijs et al., "Submicron YBa2Cu3O7–Ag–YBa2Cu3O7–Superconducting Proximity Junctions", Appl. Phys. lett. 59 (10), Sep. 2, 1991, pp. 1233–1235.

*Primary Examiner*—Marie Yamnitzky
*Attorney, Agent, or Firm*—Jones Volentine, LLP

[57] ABSTRACT

A bicrystal substrate is formed by joining end faces of a first single crystal substrate and a second single crystal substrate, the end faces having different crystal orientations. A high critical temperature superconducting thin film is then epitaxially formed on the bicrystal substrate. The superconducting thin film is etched so as to form a first superconducting electrode on the first single crystal substrate, a second superconducting electrode on the second single crystal substrate, and a superconducting bridge across a joint between the first and second single crystal substrates and connecting the first electrode and the second electrode. A conductive film is formed on the superconducting bridge by vapor deposition, and is then etched so as to form a weak link on a part of the superconducting bridge over the joint.

10 Claims, 5 Drawing Sheets

METHOD OF MANUFACTURING A HIGH TEMPERATURE SUPERCONDUCTING JOSEPHSON DEVICE

This is a Divisional of application Ser. No. 08/652,680, filed May 30, 1996, (now U.S. Pat. No. 5,849,669).

BACKGROUND OF THE INVENTION

The present invention relates to a high critical temperature superconducting Josephson device formed on a bicrystal substrate, and to a method for manufacturing it.

Conventional high critical temperature superconducting Josephson devices formed on bicrystal substrates are described, for example, in "Orientation Dependence of Grain-Boundary Critical Currents in $YBa_2Cu_3O_{7-\delta}$ Bicrystals", D. Dimos et al., Physical Review Letters, Vol. 61, Number 2, 1988, pp. 219–222, and "Superconducting Transport Properties of $Bi_2Sr_2CaCu_2O_{8+x}$ Bicrystal Grain Boundary Junctions", B. Mayer et al., Appl. Phys. Lett., Vol. 63 (7), 16 Aug. 1993, pp. 996–998.

These references describe that a Josephson Junction, wherein a superconducting bridge encloses a barrier part with weak superconducting properties (i.e., insulating part) is formed by epitaxially growing a superconducting thin film on a bicrystal line which is a Junction surface of a bicrystal substrate so that the crystal grain-boundaries are collected together exactly on the bicrystal line.

However, in the conventional Josephson device, the properties of the barrier part have a dependence on various conditions such as the linearity of the bicrystal line and the method of growing the superconducting oxide film, hence production yields of the Josephson device were poor. Further, as it is difficult to control the properties of fine crystal grain boundaries having a size of nanometer levels or below, it was technically difficult to provide a high critical temperature superconducting Josephson allay having an uniform critical current.

SUMMARY OF THE INVENTION

It is therefore an object of the present invention to provide a high critical temperature superconducting Josephson device having stable properties not easily affected by the state of the bicrystal line, and a method for manufacturing the same.

According to the present invention, a high critical temperature superconducting Josephson device comprises a bicrystal substrate including a first single crystal substrate and a second single crystal substrate, end faces of the first single crystal substrate and the second single crystal having different crystal orientations and being joined to each other; a first superconducting electrode as a high critical temperature superconducting thin film formed on the first single crystal substrate; a second superconducting electrode as a high critical temperature superconducting thin film formed on the second single crystal substrate; a superconducting bridge as a high critical temperature superconducting thin film formed on the bicrystal substrate across a joint between the first and second single crystal substrates, the superconducting bridge connecting the first electrode and the second electrode; and a weak link formed on a part of the superconducting bridge over the joint.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Some preferred embodiments of the present invention will now be described in detail with reference to the drawings.

First Embodiment

Figure 1A:
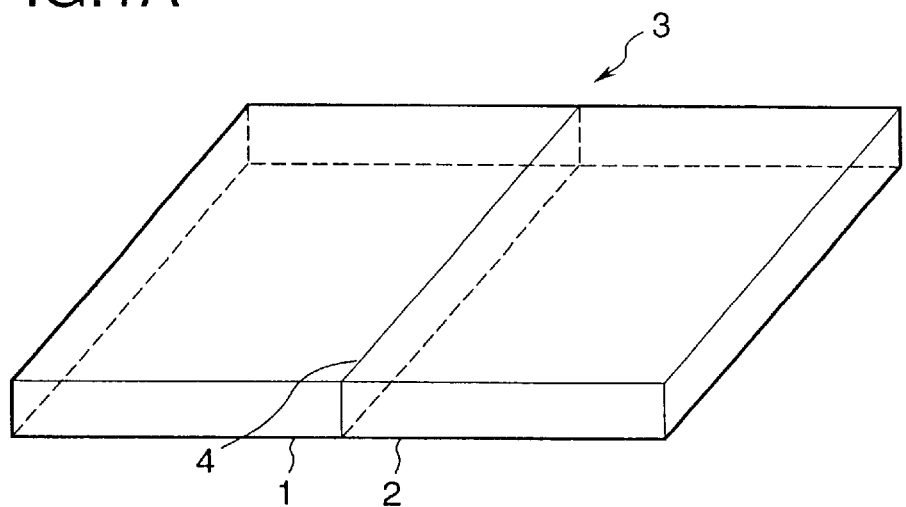
FIGS. 1A–1C are perspective views schematically showing a method for manufacturing a Josephson device according to a first embodiment of the present invention.
Figure 1B:
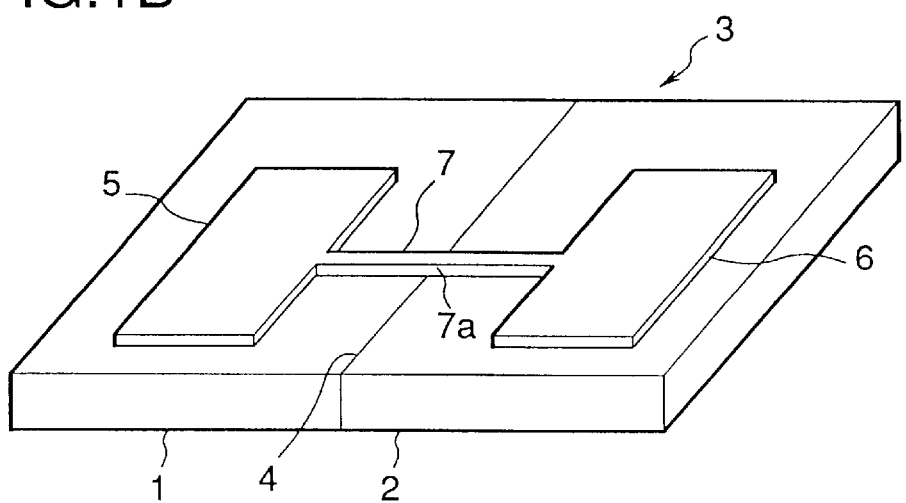
Figure 1C:
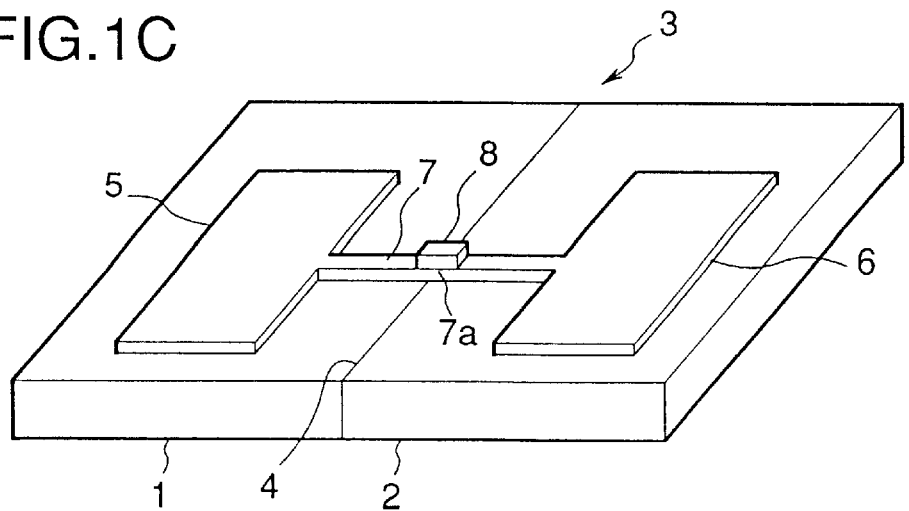
Figure 2A:
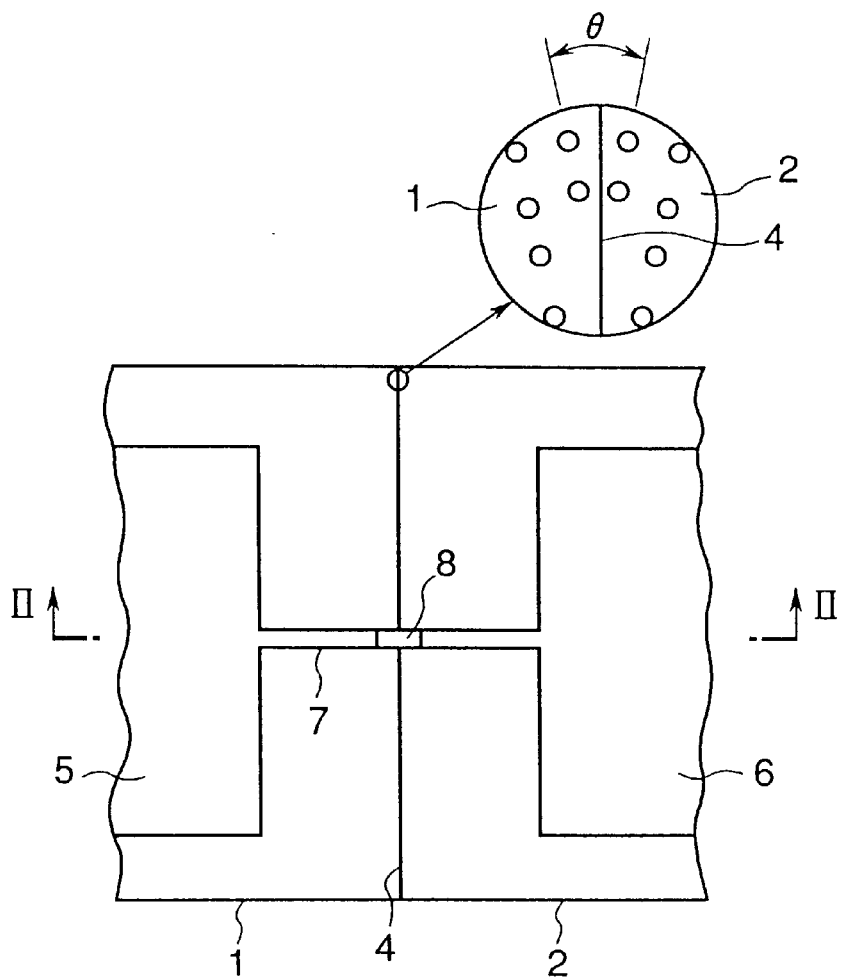
FIGS. 2A and 2B are respectively a plan view schematically showing the Josephson device manufactured by the process of FIGS. 1A–1C and a sectional view along a line II—II of FIG. 2A.
Figure 2B:
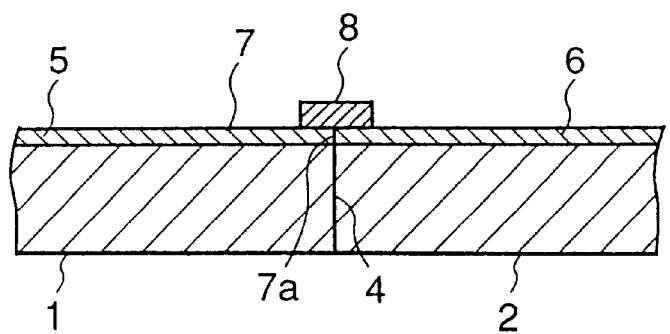

FIGS. 1A–1C are perspective views schematically showing a method for manufacturing a high critical temperature superconducting Josephson device according to a first embodiment. FIG. 2A is a plan view schematically showing the structure of the Josephson device manufactured by the process shown in FIGS. 1A–1C, and FIG. 2B is a sectional view along a line II—II of FIG. 2A.

When the Josephson device of the first embodiment is manufactured, as shown in FIG. 1A, a bicrystal substrate 3 is first formed by joining the end faces of a single crystal 1 and a single crystal 2 having different crystal orientations. The junction surface of the single crystal 1 and the single crystal 2 forms a bicrystal line 4. The single crystal 1 and the single crystal 2 may, for example, be $SrTiO_3$ (commercial product). As shown in FIG. 2A, the crystal angle θ between crystal faces of the single crystal 1 and the single crystal 2 is, for example, 24 degrees, however the crystal angle θ may be another angle. Further, the single crystal 1 and the single crystal 2 may be made from other materials such as MgO, $LaAlO_3$, $ZrO_2$, Si or sapphire which can form high critical temperature superconducting thin films.

Next, the surface of the bicrystal substrate 3 is washed with an organic solvent.

Next, as shown in FIG. 1B, a high temperature superconducting thin film of $YBa_2Cu_3O_7$(YBCO) is grown on the bicrystal substrate 3 by epitaxial growth to form the uniform film of approximately 100 [nm], and patterning is performed using photolithography technique and etching process. The thickness of the high temperature superconducting thin film is not limited to 100 [nm]. In the aforesaid fine patterning, a superconducting electrode 5 on the single crystal 1, a superconducting electrode 6 on the single crystal 2, and a superconducting bridge 7 connecting the superconducting electrodes 5 and 6 are formed. The superconducting bridge 7 is formed such that its longitudinal direction is perpendicular to the bicrystal line 4. As a result, crystal grain boundaries collect in a part 7a of the superconducting bridge 7 situated precisely on the bicrystal line 4. According to the first embodiment, the length of the superconducting bridge 7 is ten or more micrometers and its width is several micrometers. Instead of the high critical temperature superconducting material $YBa_2Cu_3O_7$, copper oxide high critical temperature superconducting materials such as $Bi_2Sr_2CaCu_2O_8$, $(Bi, Pb)_2Sr_2Ca_2Cu_3O_8$ and $TlBa_2CaCu_2O_8$, $TlBa_2Ca_2Cu_3O_{10}$, or isotropic oxide superconducting materials such as $(BaK)BiO_3$ and $(BaRb)BiO_3$, may be used.

Next, a metallic film of Au is vapor deposited to a thickness of approximately 100 [nm] on the superconducting bridge 7, and the fine working is performed to the metallic film, thereby forming a weak link 8 (i.e., a region of weakened superconductivity) on the part 7a of the superconducting bridge 7. According to the first embodiment, the length of the weak link 8 is several micrometers, and it is formed such that its width is no greater than that of the superconducting bridge 7. Herein, the term "weak link" means that two parts of a superconductor are joined together by a weak interaction. Instead of Au, metals of good conductivity such as Ag, Al and Cu, or semiconductors such as Si, Ge and GaAs, may be used.

Next, the action of the Josephson device according to the first embodiment will be described in comparison to the action of a Josephson device without the weak link 8.

Figure 3:
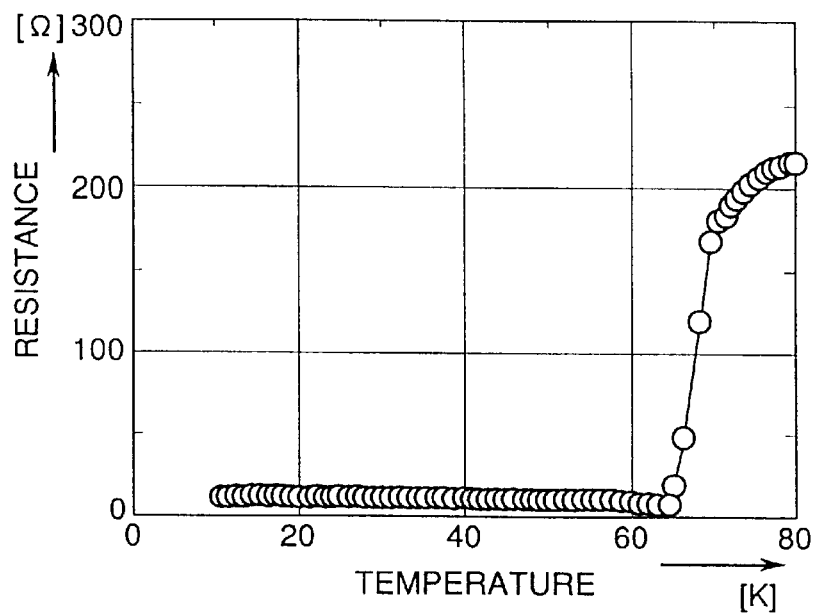
FIG. 3 shows the measurement results for temperature dependence of the resistance of the barrier part including the crystal grain boundaries in the superconducting bridge.

When the weak link 8 is not provided on the superconducting bridge 7, as the thickness of the superconducting bridge 7 is very small, for example, approximately 100 [nm], it may occur that the part 7a of the superconducting bridge 7 situated precisely on the bicrystal line 4 does not become superconducting, i.e. that the assembly does not function as a Josephson device, even when the superconducting electrodes 5 and 6 become superconducting at or below the critical temperature. FIG. 3 shows the measurement results for temperature dependence of the resistance of the part 7a including the crystal grain boundaries of the superconducting bridge 7. FIG. 3 shows that even at or below the critical temperature of the superconducting thin film (in FIG. 3, approximately 65 [K]), the part 7a including crystal grain boundaries does not become superconducting (i.e., resistance value 0 [Ω]), that it has a residual resistance of approximately 8 [Ω], and that this value has almost no temperature dependence at or below the critical temperature.

Figure 4:
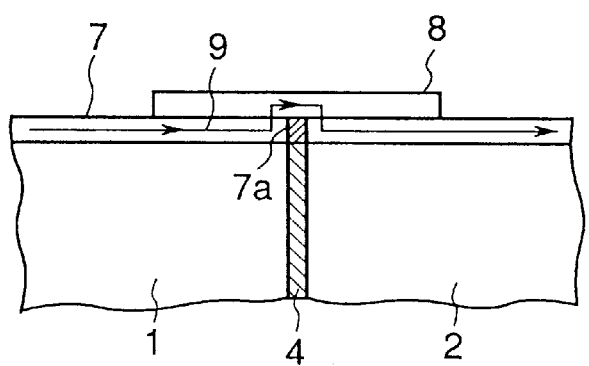
FIG. 4 is an explanatory diagram showing a superconducting current flowing into the weak link.

On the other hand, the weak link 8 of the Josephson device according to the first embodiment has superconducting properties due to a proximity effect of the superconducting bridge 7. In this context, the term "proximity effect" signifies a phenomenon wherein, when a superconductor forms a bond with an ordinary conductor, the superconducting properties are induced in a part of the ordinary conductor adjacent to the superconductor at or below the critical temperature of the superconductor. Comparing the Au metal which is the material of the weak link 8 and the crystal grain boundaries, the coherence length of the superconducting pair electrons in Au is far longer than that of the crystal grain boundaries of the part 7a. Superconducting properties of the crystal grain boundaries disappear at the YBCO coherence length having the wavelength of several angstroms. This is described in the paper by G. Deutscher and K. A. Muller, published in Phys. Rev. Lett. Vol. 59, pp.1745, 1987. On the other hand, Superconducting properties of the metal link functioning as the weak link are induced in the range of coherence length $\xi_n$: $\xi_n = (h D/4\pi^2 K_B T)^{1/2}$, where h denotes Plank constant, D denotes a diffusion constant, $K_B$ denotes Boltzman constant, T denotes temperature. This is described in the book "Principles of the Superconductive Devices and Circuits", T. Van Duzer and C. W. Turner, Elsevier, New York, 1981, Chap. 7. For example, when Ag is in contact with the high critical temperature superconductor, an experimental result is obtained that $\xi = 100$ [nm]/$T^{1/2}$. This is described in the paper by M. A. M. Gijs, et al., in Appl. Phys. Lett., Vol. 59, pp. 1233, 1991. Accordingly, the weak link of the superconductors is formed in Ag instead of the grain boundary. Consequently, as shown in FIG. 4, a superconducting current 9 that cannot cross the crystal grain boundaries in the part 7a of the superconducting bridge 7 situated precisely on the bicrystal line 4, flows into the weak link 8 from one side of the superconducting bridge 7, and flows out the other side of the superconducting bridge 7 from the weak link 8.

Hence, according to the first embodiment as described hereinabove, by suitably choosing the material of the metal film weak link 8 and its dimensions, the properties of the weak link 8 which acts as a superconducting barrier can easily be controlled, and the production yield of the Josephson device can thereby be improved.

Further, as the crystal grain boundaries of the superconducting oxide are not used as a superconducting barrier, there is no problem of reduction of critical temperature due to the crystal grain boundaries, and the Josephson device having a similar high critical temperature as a superconducting film can be implemented.

The Josephson device according to the first embodiment is particularly suitable when used as a SQUID (superconducting quantum interference device). or as an oscillator in a microwave or milliwave circuit.

Second Embodiment

Figure 5:
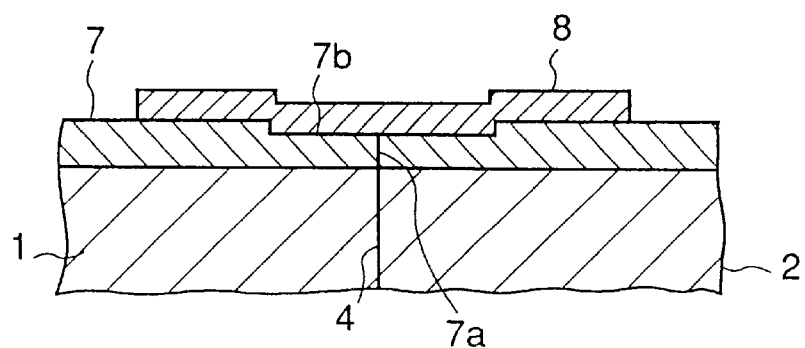
FIG. 5 is a sectional view schematically showing the structure of a high critical temperature superconducting Josephson device according to a second embodiment of the present invention.

FIG. 5 is a vertical sectional view schematically showing the structure of a high critical temperature superconducting Josephson device according to a second embodiment. In FIG. 5, the same symbols are used for parts which have an identical or corresponding structure to that of FIGS. 1A–1C and FIG. 4. The second embodiment is identical to the first embodiment excepting that a groove 7b having a depth of several nanometers is formed on the surface of the superconducting bridge 7 by etching a part directly on and near the bicrystal line 4 in the superconducting bridge 7, and the weak link 8 is formed over the groove 7b.

The reason why the surface of the center part of the superconducting bridge 7 is removed by etching, and the weak link 8 is formed over the groove 7b that is formed as shown in FIG. 5, is that depending on the method used to manufacture the high critical temperature superconducting film, there is a possibility that a thin, deteriorated layer may form on the surface of the superconducting bridge 7 which might interfere with the proximity effect of the weak link 8. According to the second embodiment, a superconductor/ordinary conductor metal interface is formed between the superconducting bridge 7 and the weak metal link 8, which easily gives rise to a Josephson effect, and the production yield of the device is consequently further improved. The remaining features of the second embodiment are identical to those of the first embodiment.

Third Embodiment

Figure 6:
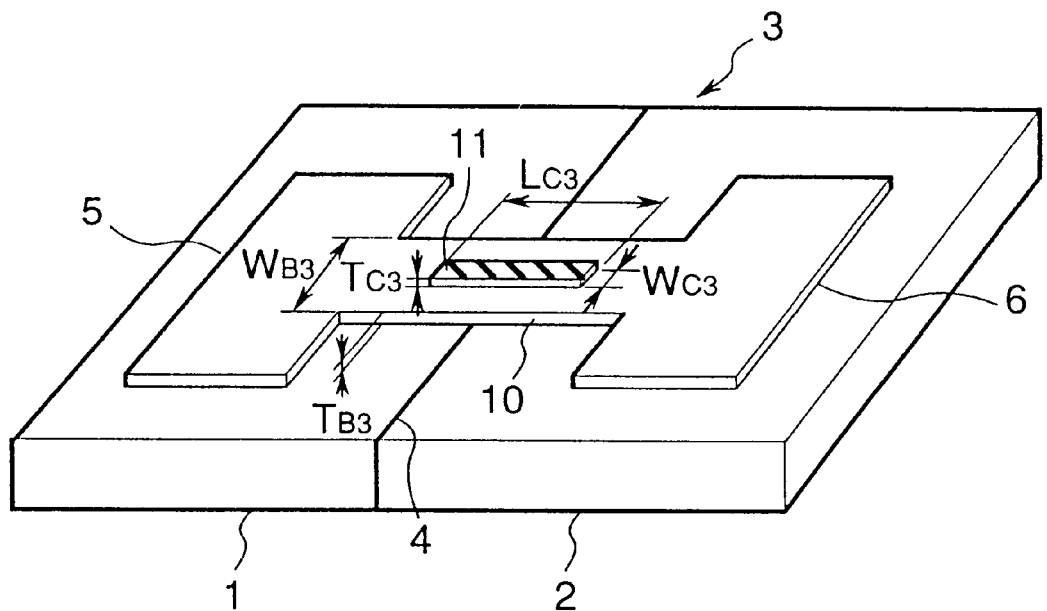
FIG. 6 is a schematic perspective view showing a high critical temperature superconducting Josephson device according to a third embodiment of the present invention.

FIG. 6 is a schematic perspective view showing a high critical temperature superconducting Josephson device according to a third embodiment. In FIG. 6, the same symbols are used for parts which have an identical or corresponding structure to those of FIG. 1C. The third embodiment is identical to the first embodiment except that the width of a superconducting bridge 10 is formed much larger than the width of a weak link 11. The width $W_{B3}$ and thickness $T_{B3}$ of the superconducting bridge 10 are, for example, $W_{B3}$=10 [$\mu$m] and $W_{B3}$=300 [nm]. The width $W_{C3}$, the length $L_{C3}$ and the thickness $T_{C3}$ of the weak link 11 are, for example, $W_{C3}$=3 [$\mu$m], $L_{C3}$=20 [$\mu$m], $T_{C3}$=100 [nm]. The properties of the Josephson device according to the third embodiment are determined by the shape of the weak link 11 and are not much affected by the shape of the superconducting bridge 10. The remaining features of the third embodiment are identical to those of the first embodiment.

Fourth Embodiment

Figure 7:
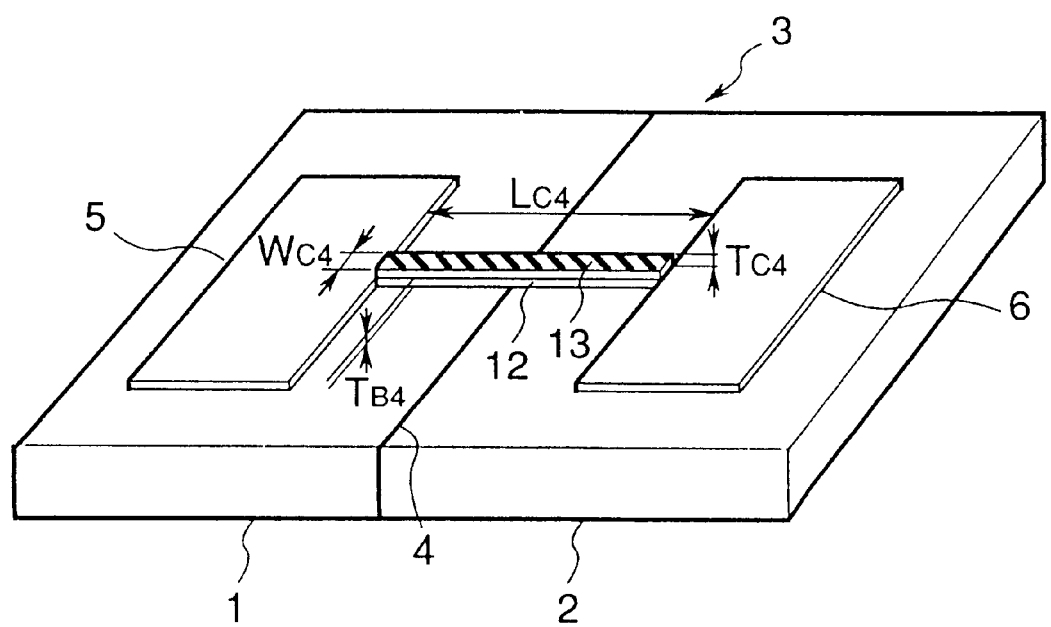
FIG. 7 is a schematic perspective view showing a high critical temperature superconducting Josephson device according to a fourth embodiment of the present invention.

FIG. 7 is a schematic perspective view showing a high critical temperature superconducting Josephson device according to a fourth embodiment. In FIG. 7, the same symbols are used for parts which have an identical or corresponding structure to those of FIG. 1C. The fourth embodiment is identical to the first embodiment except that the width and the length of a superconducting bridge 12 are formed equal to the width and the length of a weak link 13. The width $W_{C4}$, the length $L_{C4}$ and the thickness $T_{C4}$ of the superconducting bridge 12 are, for example, $W_{C4}$=2 [$\mu$m], $L_{C4}$=30 [$\mu$m] and $T_{C4}$=100 [nm]. The thickness $T_{B4}$ of the superconducting bridge 12 is, for example, $T_{B4}$=200 [nm]. The advantage of the fourth embodiment is that the weak link 13 and the superconducting bridge 12 can be worked together. The remaining features of the fourth embodiment are identical to those of the first embodiment.

Fifth Embodiment

Figure 8:
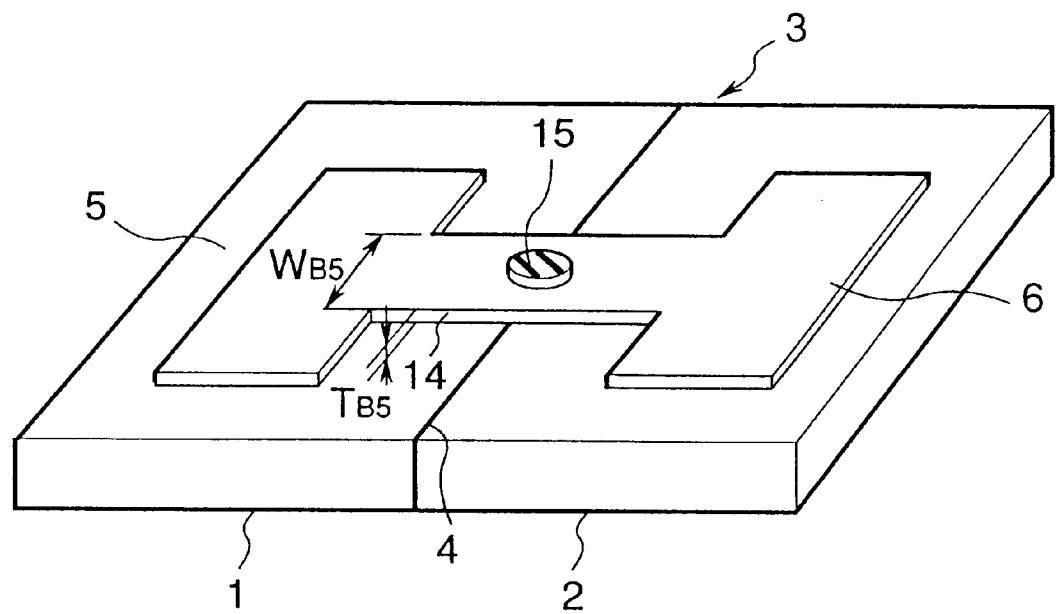
FIG. 8 is a schematic perspective view showing a high critical temperature superconducting Josephson device according to a fifth embodiment of the present invention.

FIG. 8 is a schematic perspective view of a Josephson device according to a fifth embodiment. In FIG. 8, the same symbols are used for parts which have an identical or corresponding structure to those of FIG. 1C. The fifth embodiment is identical to the first embodiment except that the width of a superconducting bridge 14 is formed much larger than that of a weak link 15, and that the weak link 15 is circular. The width $W_{B5}$ and the thickness $T_{B5}$ of the superconducting bridge 14 are, for example, $W_{B5}$=8 [$\mu$m] and $T_{B5}$=200 [nm]. The diameter $\phi_{C5}$ and the thickness $T_{C5}$ of the weak link 15 are, for example, $\phi_{C5}$=5 [$\mu$m] and $T_{C5}$=50 [nm]. In general, it is difficult to form a thin film having strict right-angle corners by photolithography technique using a photomask which has a slit with right-angle corners, because the corners of the thin film is chamfered. It is therefore easier to manufacture the circular weak link 15 of to the fifth embodiment than an angular weak link, hence the production process is simplified. The remaining features of the fifth embodiment are identical to those of the first embodiment.

Sixth Embodiment

Figure 9:
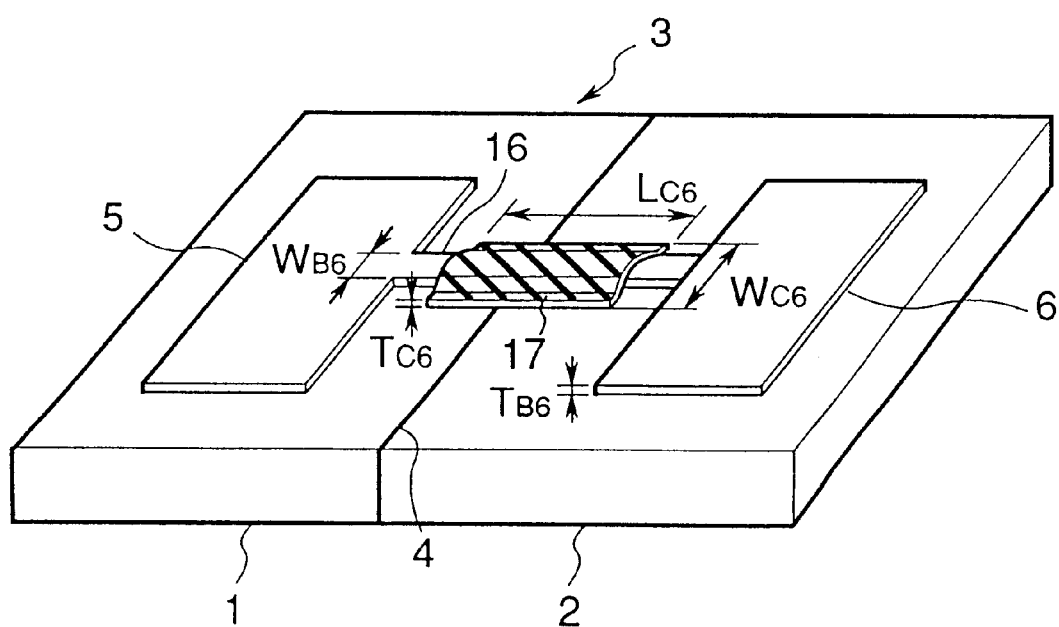
FIG. 9 is a schematic perspective view showing a high critical temperature superconducting Josephson device according to a sixth embodiment of the present invention.

FIG. 9 is a schematic perspective view showing a high critical temperature superconducting Josephson device according to a sixth embodiment. In FIG. 9, the same symbols are used for parts which have an identical or corresponding structure to those of FIG. 1C. The sixth embodiment is identical to the first embodiment except that a weak link 17 is formed covering not only the surface (generally including the "a" and "b" axes in crystal system) but also the sides (generally including the "c" axis in crystal system) of the superconducting bridge 16. In general, the high critical temperature superconducting oxide film is grown on the single crystal substrate so as to make "c" axis in crystal system normal to the surface of the substrate and make "a" and "b" axes in crystal system normal to the "c" axis (i.e., parallel to the surface of the substrate). Since a superconductor such as YBCO has a strong electrical anisotropy, the coherence length of the electron pair along the "c" axis is several angstroms, and the coherence length of the electron pair along the "a" or "b" axis is several ten angstroms. The proximity effect along the "a" or "b" axis therefore become larger than that along the "c" axis. According to the sixth embodiment, a strong proximity effect is obtained on the weak link in contact with the sides of the superconducting bridge 16. The width $W_{B6}$ and the thickness $T_{B6}$ of the superconducting bridge 16 are, for example, $W_{B6}$=2 [$\mu$m] and $T_{B5}$=300 [nm]. The width $W_{C6}$, the thickness $T_{C6}$ and the length $L_{C6}$ of the weak link 17 are, for example, $W_{B6}$=6 [$\mu$m], $T_{B5}$=100 [nm] and $L_{C6}$=20 [$\mu$m]. The remaining features of the sixth embodiment are identical to those of the first embodiment.

What is claimed is:

1. A method of manufacturing a high temperature superconducting Josephson device, said method comprising:

forming a bicrystal substrate by joining end faces of a first single crystal substrate and a second single crystal substrate, said end faces having different crystal orientations;

epitaxially forming a high critical temperature superconducting film on said bicrystal substrate;

etching said superconducting film so as to form a first superconducting electrode on said first single crystal substrate, a second superconducting electrode on said second single crystal substrate, and a superconducting bridge across a joint between said first and second single crystal substrates and connecting said first electrode and said second electrode;

forming a conductive film on said superconducting bridge by vapor deposition; and etching said conductive film so as to form a weak link on a part of said superconducting bridge over said joint.

2. The method of claim 1 further comprising removing a part of a surface of said superconducting bridge upon which said weak link is formed, prior to forming said conductive film.

3. The method of claim 1, wherein said first and second single crystal substrates are made from a material selected from the group consisting of $SrTiO_3$, MgO, $LaAlO_3$, $ZrO_2$, Si, Ge, GaAs and sapphire.

4. The method of claim 1, wherein said first and second superconducting electrodes and said superconducting bridge are made from a material selected from the group consisting of $YBa_2Cu_3O_7$, $Bi_2Sr_2CaCu_2O_8$, $(Bi,Pb)_2Sr_2Ca_2Cu_3O_8$, $TlBa_2CaCu_2O_8$, $TlBa_2Ca_2Cu_3O_{10}$, $(BaK)BiO_3$ and $(BaRb)BiO_3$.

5. The method of claim 1, wherein said weak link is made from a material selected from the group consisting of Au, Ag, Al, Cu, Si, Ge and GaAs.

6. The method of claim 1, wherein a width of said weak link is equal to a width of said superconducting bridge.

7. The method of claim 5, wherein a length of said weak link is equal to a length of said superconducting bridge.

8. The method of claim 1, wherein a width of said weak link is narrower than a width of said superconducting bridge.

9. The method of claim 1, wherein said weak link is circular.

10. The method of claim 1, wherein said weak link covers upper and side surfaces of said superconducting bridge.

* * * * *